(12) United States Patent
Chou

(10) Patent No.: US 8,262,444 B2
(45) Date of Patent: Sep. 11, 2012

(54) ELECTRONIC DEVICE WITH AIRFLOW REVERSAL PREVENTION ASSEMBLY

(75) Inventor: Ming-Der Chou, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 1002 days.

(21) Appl. No.: 12/251,423

(22) Filed: Oct. 14, 2008

(65) Prior Publication Data

US 2010/0002386 A1    Jan. 7, 2010

(30) Foreign Application Priority Data

Jul. 1, 2008   (CN) .......................... 2008 1 0302475

(51) Int. Cl.
*H05K 5/00* (2006.01)

(52) U.S. Cl. ...................... 454/184; 361/695

(58) Field of Classification Search .................. 454/184, 454/259, 359, 353, 227, 284, 308; 361/690, 361/695
See application file for complete search history.

(56) References Cited

U.S. PATENT DOCUMENTS

| 4,080,100 | A | * | 3/1978 | McNeese | 416/189 |
| 6,108,203 | A | * | 8/2000 | Dittus et al. | 361/695 |
| 6,910,340 | B2 | * | 6/2005 | Nowak et al. | 62/115 |
| 7,347,774 | B2 | * | 3/2008 | Aronstam et al. | 454/258 |
| 7,630,201 | B2 | * | 12/2009 | Asahi | 361/695 |
| 2005/0241810 | A1 | * | 11/2005 | Malone et al. | 165/122 |
| 2007/0053143 | A1 | * | 3/2007 | Kang | 361/678 |
| 2007/0178823 | A1 | * | 8/2007 | Aronstam et al. | 454/256 |

\* cited by examiner

*Primary Examiner* — Steven B McAllister
*Assistant Examiner* — Brittany E Towns
(74) *Attorney, Agent, or Firm* — Altis Law Group, Inc.

(57) ABSTRACT

An electronic device includes a housing, and an active fan and an airflow reversal prevention assembly installed in the housing. The assembly includes a first grid plate defining a plurality of vents, a second grid plate abutting against the first grid plate, a passive fan, and an elastic member. The second grid plate defines a plurality of vents being selectively aligned with the vents of the first grid plate. The passive fan is driven by air from the active fan to rotate, thereby driving the second grid plate to slide relative to the first grid plate. Thus the vents of the second grid plate are aligned with the corresponding vents of the first grid plate. The elastic member is capable of urging the second grid plate to slide to return, whereby the vents of the second grid plate are out of alignment with the vents of the first grid plate.

10 Claims, 7 Drawing Sheets

ELECTRONIC DEVICE WITH AIRFLOW REVERSAL PREVENTION ASSEMBLY

BACKGROUND

1. Technical Field

The present disclosure relates to electronic devices and, more particularly, to a electronic device having an airflow reversal prevention assembly.

2. Description of Related Art

In recent years, electronic devices, such as computer systems, have been developed that operate at ever higher speeds, and thus generate a lot of heat during operation. Usually, heat dissipation apparatuses such as motor driven fans and blowers are applied in the electronic devices for dissipating the heated air. Air vents are defined in the enclosures of the electronic devices adjacent the place where the dissipation apparatuses are fixed, for venting the heated air therethrough. However, if one of or more of several heat dissipation apparatuses malfunction in an electronic device, heated air expelled by the remaining working apparatuses may flow back into the device through a vent or vents of the one or more malfunctioning apparatuses.

What is desired, therefore, is an electronic device which has an airflow reversal prevention assembly.

DETAILED DESCRIPTION

Figure 1:
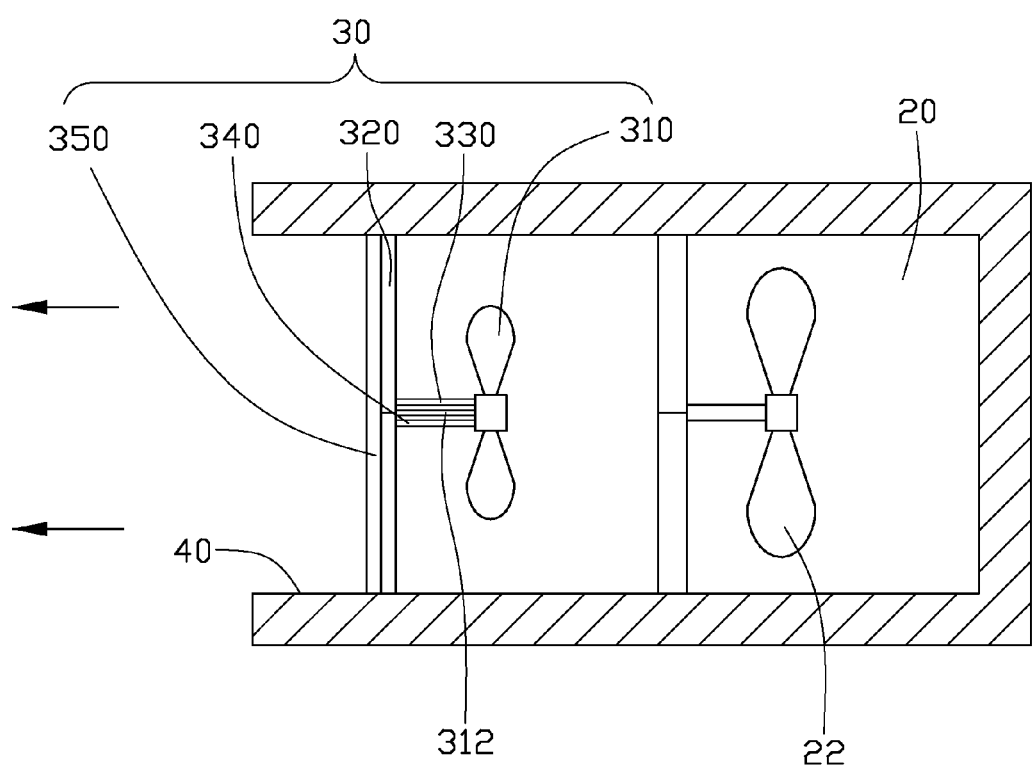
FIG. 1 is a schematic, cross-sectional view of a first embodiment of an electronic device, the electronic device including a housing, an active fan, and an airflow reversal prevention assembly which includes a passive fan, two drive members, a first grid plate, a second grid plate, and an elastic member.
Figure 2:
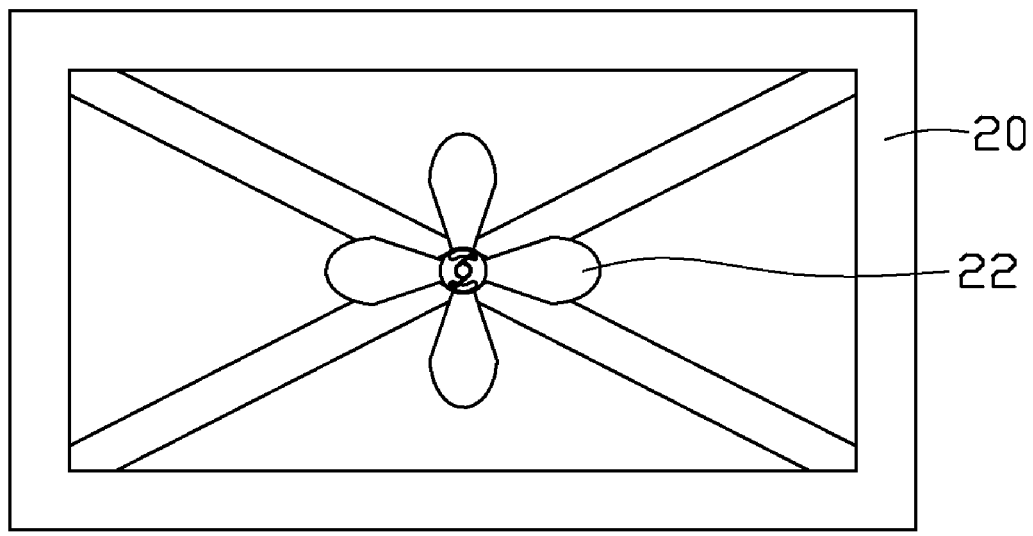
FIG. 2 is similar to FIG. 1, but viewed from another aspect.
Figure 3:
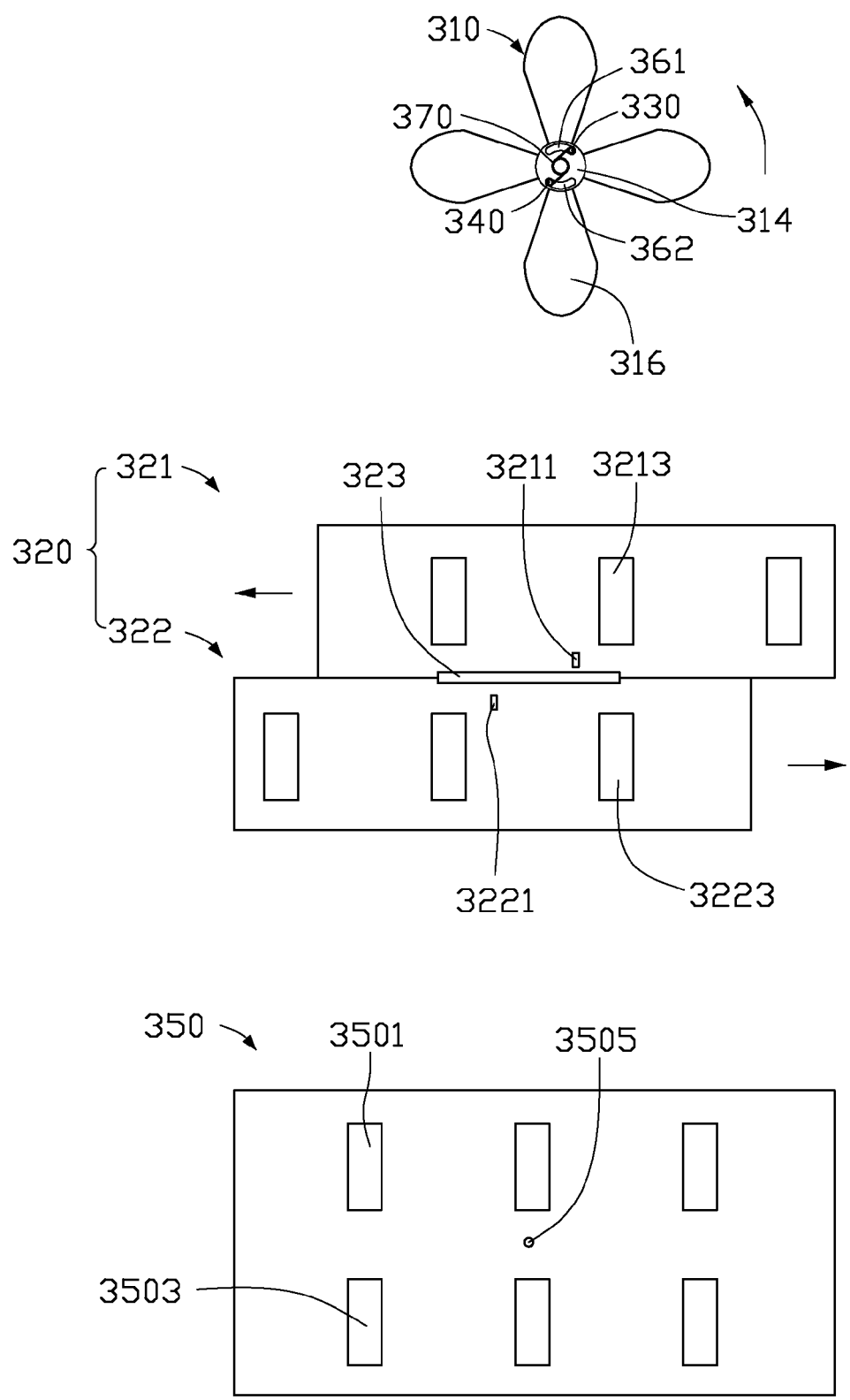
FIG. 3 is a partially-exploded, elevational view of the airflow reversal prevention assembly of FIG. 1.

Referring to FIGS. 1 to 3, in a first embodiment, an electronic device includes a housing 20 defining an outlet 40 at an end thereof, an electric active fan 22 installed in the housing 20 adjacent an end thereof opposite to the outlet 40, and an airflow reversal prevention assembly 30 fixed in the housing 20 adjacent the outlet 40. The airflow reversal prevention assembly 30 includes a passive fan 310, two drive members 330, 340, a first grid plate 350, a second grid plate 320, and an elastic member such as a torsion spring 370. The electronic device may include various functional components which are not necessary to be shown here.

The passive fan 310 can be driven by airflow from the active fan 22 to rotate. The passive fan 310 includes a stator shaft 312 and a rotor hub 314 rotatably engaging with an end of the stator shaft 312. A plurality of vanes 316 radially extends from a circumference of the rotor hub 314. Two opposite, curved slots 361, 362 are defined in an end surface of the rotor hub 314.

A plurality of vents 3501, 3503 are defined in the first grid plate 350. An orifice 3505 is defined in the first grid plate 350 amid the vents 3501, 3503 for receiving the other end of the stator shaft 31 2 of the passive fan 310.

The second grid plate 320 includes a first portion 321 and a second portion 322 juxtaposed with, and coplanar with, the first portion 321. The first portion 321 and the second portion 322 are slidable relative to each other. A plurality of spaced vents 3213 are defined in the first portion 321 corresponding to the vents 3501 of the first grid plate 350. A fixing hole 3211 is defined in the first portion 321. A plurality of spaced vents 3223 are defined in the second portion 322 corresponding to the vents 3503 of the first grid plate 350. A fixing hole 3221 is defined in the second portion 322. A notch 323 is defined in the junction of the first portion 321 and the second portion 322.

Figure 4:
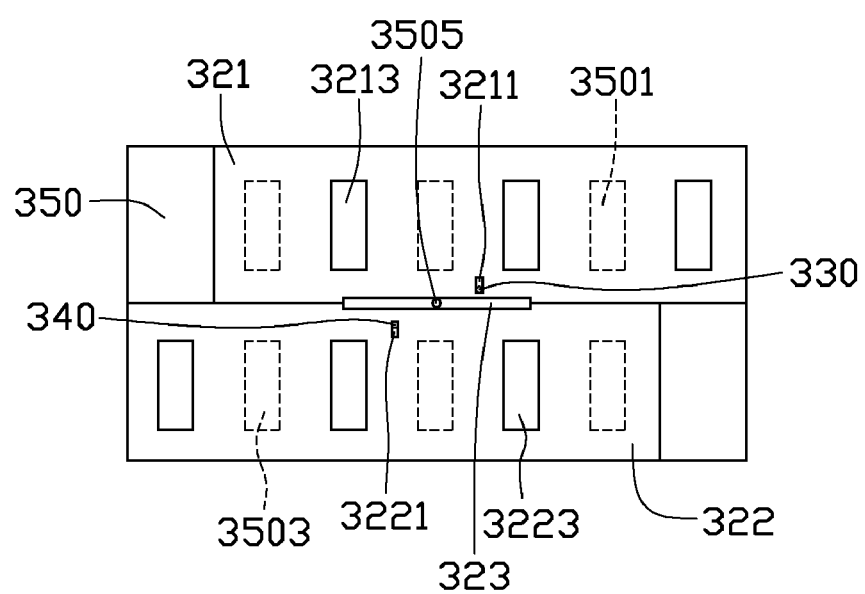
FIG. 4 is a plan view of the second grid plate clinging to the first grid plate of FIG. 3 in parallel, showing the airflow reversal prevention assembly in a closed position.

Referring also to FIG. 4, in assembly, one end of the drive member 330 is received in the slot 361 of the passive fan 310, and the other end of the drive member 330 is inserted in the fixing hole 3211 of the first portion 321 of the second grid plate 320. One end of the drive member 340 is received in the slot 362 of the passive fan 310, and the other end of the drive member 340 is inserted in the fixing hole 3221 of the second portion 322 of the second grid plate 320. The other end of the stator shaft 312 of the passive fan 310 is passed through the notch 323 of the second grid plate 320. The torsion spring 370 is fixed at the end of the stator shaft 312 of the passive fan 310, with two ends of the torsion spring 370 urging against the drive members 330, 340. The combined second grid plate 320 and passive fan 310 are fixed in the housing 20 adjacent the outlet 40. The first grid plate 350 is secured in the housing 20 and clings to the second grid plate 320 in parallel, with the other end of the stator shaft 312 of the passive fan 310 being fixed in the orifice 3505 of the first grid plate 350. Thus, the airflow reversal prevention assembly 30 is fixed in the housing 20. The vents 3213, 3223 of the second grid plate 320 are biased to be out of alignment with the vents 3501, 3503 of the first grid plate 350. At this time, the airflow reversal prevention assembly 30 is in a closed position, and air from outside of the housing 20 cannot flow into the housing 20 through the outlet 40.

Figure 5:
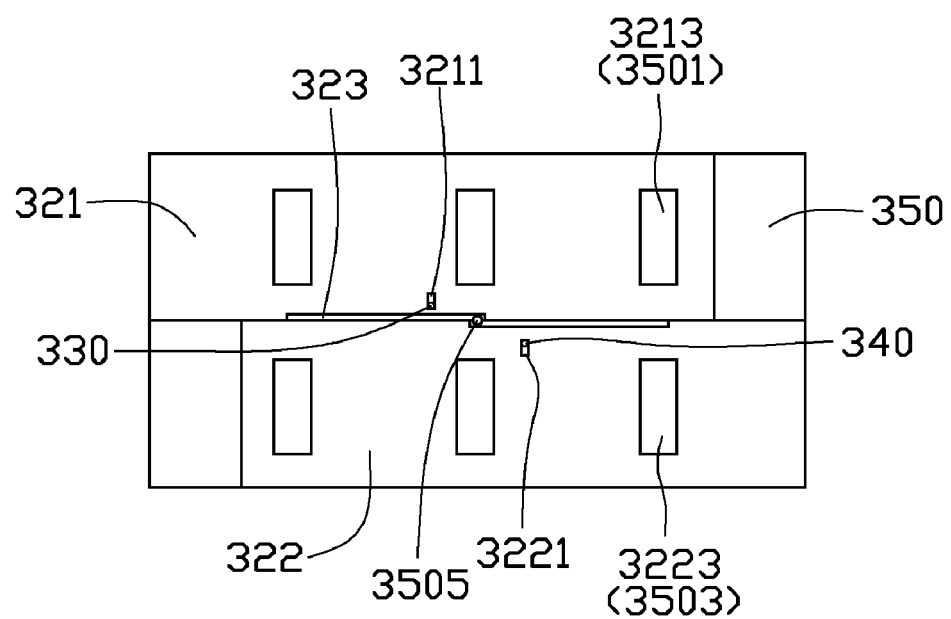
FIG. 5 is a plan view similar to FIG. 4, except that the airflow reversal prevention assembly is in an open position.

Referring also to FIG. 5, in use, when the active fan 22 of the electronic device rotates, air within the housing 20 drives the rotor hub 314 and vanes 316 of the passive fan 310 to rotate, thus, the first and second portions 321, 322 of the second grid plate 320 slide relative to the first grid plate 350 driven the drive members 330, 340. The torsion spring 370 is deformed by urging of the drive members 330, 340. The vents 3213, 3223 of the second grid plate 320 are aligned with the corresponding vents 3501, 3503 of the first grid plate 350. The airflow reversal prevention assembly 30 is in an open position. Thus, heated air passes from within through the vents 3213, 3223 of the second grid plate 320 and the corresponding vents 3501, 3503 of the first grid plate 350, to flow out through the outlet 40.

When the active fan 24 stops rotating, the torsion spring 370 restores, causing the rotor hub 314 and vanes 316 of the passive fan 310 to rotate in a reverse direction, which causes the first and second portions 321, 322 to slide relative to the first grid plate 350. The vents 3213, 3223 of the second grid plate 320 are once again out of alignment with the vents 3501, 3503 of the first grid plate 350, preventing air flowing into the housing 20 through the outlet 40. Thus the airflow reversal prevention assembly 30 is in the closed position.

Figure 6:
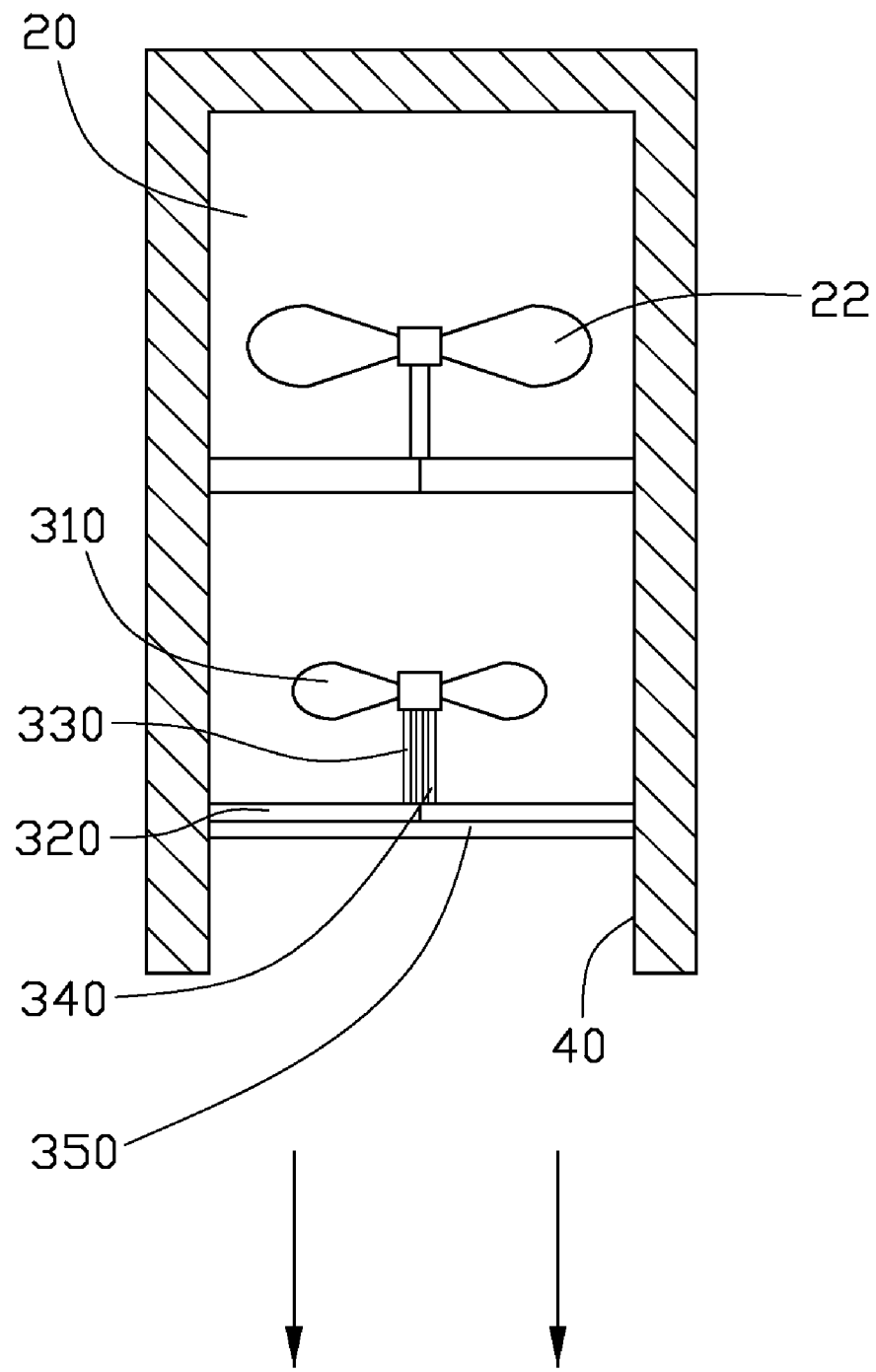
FIG. 6 shows a different using state from FIG. 1, the electronic device being operated at a different angle.

The electronic device can be placed in random positions to meet requirements of a variety of applications, for example, FIG. 6 shows the electronic device operating at a different angle. The airflow reversal prevention assembly 30 may operate at any angle free of effects of gravity.

Figure 7:
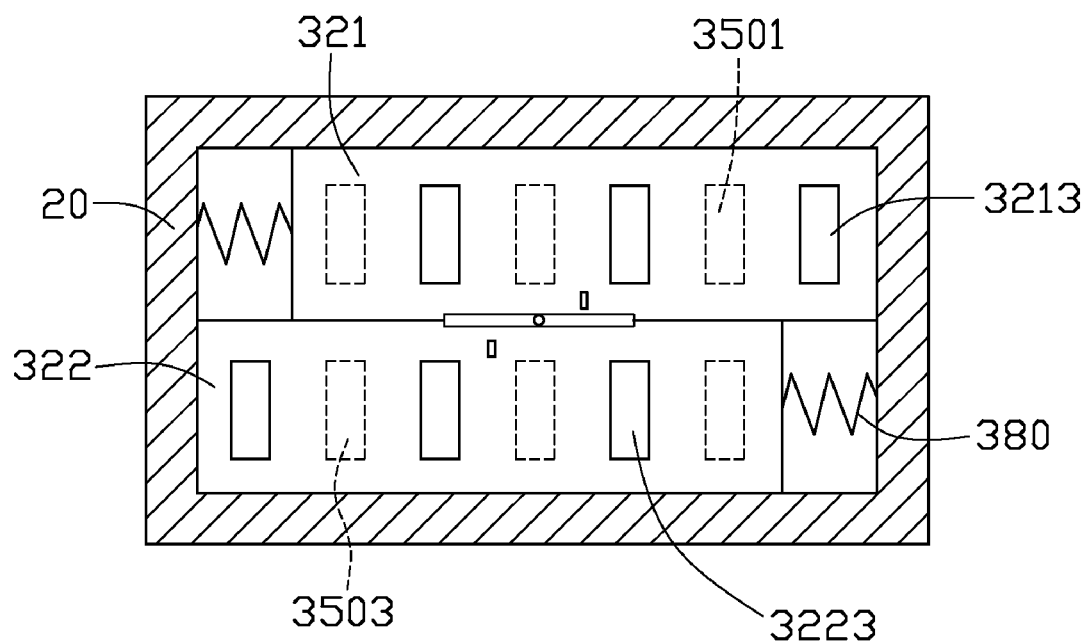
FIG. 7 is a schematic, cross-sectional view of a second embodiment of an electronic device.

Referring also to FIG. 7, in a second embodiment, the torsion spring 370 is replaced with two elastic members such as two compression springs 380 respectively located between two lateral walls of the housing 20 and the first and second portions 321, 322 of the second grid plate 320.

Additionally, the airflow reversal prevention assembly 30 may be applied to ventilators or air conditioners which are used in sealed spaces such as air conditioned rooms.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electronic device comprising:
    a housing defining an outlet;
    an active fan installed in the housing; and
    an airflow reversal prevention assembly fixed in the housing, comprising:
        a first grid plate defining a plurality of vents;
        a second grid plate clinging to the first grid plate in parallel, the second grid plate defining a plurality of vents being selectively aligned with the vents of the first grid plate;
        a passive fan comprising a stator shaft unmovable relative to the first grid plate, and a plurality of vanes rotatably mounted to the stator shaft to be driven to rotate about the stator shaft by air from the active fan;
        at least one drive member connected between the second grid plate and the vanes of the passive fan, such that the second grid plate is moved with the rotation of the vanes of the passive fan to align the vents of the second grid plate with the vents of the first grid plate; and
        at least one elastic member to bias the second grid plate to move back to make the vents of the second grid plate being out of alignment with the vents of the first grid plate.

2. The electronic device as described in claim 1, wherein the at least one driving member comprises two drive members, the second grid plate comprises a first portion and a second portion, each of the first and second portion defines a fixing hole, the passive fan further comprises a rotor hub rotatably sleeved on the stator shaft, the vanes radially extending from the rotor hub to drive the rotor hub to rotate with the vanes, two slots are defined in the rotor hub of the passive fan, opposite ends of each of the drive members are respectively engaged in one of the slots of the rotor hub and the corresponding one fixing hole of the second grid plate to enable the first and second portions of the second grid plate to slide in opposite directions with the rotating of the vanes.

3. The electronic device as described in claim 2, wherein said at least one elastic member comprises a torsion spring fixed to the stator shaft of the passive fan, and two ends of the torsion spring urge against the drive members.

4. An electronic device comprising:
    a housing;
    an electric fan installed in the housing;
    a first grid plate attached in the housing and spaced from the electric fan, the first grid plate defining a plurality of vents;
    a second grid plate abutting against the first grid plate in parallel, the second grid plate defining a plurality of vents capable of being aligned with the vents of the first grid plate;
    a passive fan located between the electric fan and the second grid plate, and comprising a stator shaft fixed to the first grid plate, and a plurality of vanes rotatably mounted to the stator shaft and connected to the second grid plate to drive the second grid plate to slide relative to the first grid plate to a first position, where the vents of the second grid plate are aligned with the vents of the first grid plate, in response to the vanes of the passive fan being driven to rotate about the stator shaft by air from the electric fan; and
    elastic means for biasing the second grid plate to slide relative to the first grid plate to a second position, where the vents of the second grid plate is out of alignment with the vents of the first grid plate.

5. The electronic device as described in claim 4, wherein the passive fan further comprises a rotor hub rotatably engaging with the stator shaft, the vanes are radially extending from the rotor hub to drive the rotor hub to rotate with the vanes.

6. The electronic device as described in claim 5, further comprising two driving members, wherein the second grid plate comprises a first portion and a second portion coplanar with the first portion, one of the drive members is connected to the first portion and the rotor hub of the passive fan, to drive the first portion in to slide when the vanes of the passive fan rotates; and the other drive member is connected to the second portion and the rotor hub of the passive fan, to drive the second portion to slide when vanes of the passive fan rotates.

7. The electronic device as described in claim 6, wherein the elastic means comprises a torsion spring fixed to the stator shaft of the passive fan, and two ends of the torsion spring urge against the drive members respectively.

8. The electronic device as described in claim 6, wherein the elastic means comprises two springs respectively located between two lateral walls of the housing and the first and second portions of the second grid plate.

9. The electronic device as described in claim 2, wherein each of the slots of the rotor hub extends in a curved path.

10. The electronic device as described in claim 2, wherein each of the fixing holes of the second grid plate extends in a direction substantially perpendicular to a moving direction of the second grid plate.

* * * * *